(12) United States Patent
Mao et al.

(10) Patent No.: US 11,122,712 B2
(45) Date of Patent: Sep. 14, 2021

(54) COOLING DEVICE FOR DATA CENTER AND COOLING SYSTEM FOR DATA CENTER

(71) Applicant: Shenzhen Fugui Precision Ind. Co., Ltd., Shenzhen (CN)

(72) Inventors: Tze-Chern Mao, Neihu (TW);
Yen-Chun Fu, New Taipei (TW);
Chih-Hung Chang, New Taipei (TW);
Hui-Hsuan Wang, Neihu (TW);
Yao-Ting Chang, New Taipei (TW);
Chao-Ke Wei, New Taipei (TW)

(73) Assignee: Shenzhen Fugui Precision Ind. Co., Ltd., Shenzhen (CN)

( * ) Notice: Subject to any disclaimer, the term of this patent is extended or adjusted under 35 U.S.C. 154(b) by 139 days.

(21) Appl. No.: 16/296,346

(22) Filed: Mar. 8, 2019

(65) Prior Publication Data

US 2020/0236814 A1    Jul. 23, 2020

(30) Foreign Application Priority Data

Jan. 21, 2019    (CN) ........................ 201910054983.X

(51) Int. Cl.
*H05K 7/20*          (2006.01)

(52) U.S. Cl.
CPC ..... *H05K 7/20745* (2013.01); *H05K 7/20827* (2013.01); *H05K 7/20836* (2013.01)

(58) Field of Classification Search
CPC ........... H05K 7/20827; H05K 7/20745; H05K 7/20836
See application file for complete search history.

(56) References Cited

U.S. PATENT DOCUMENTS

| | | | |
|---|---|---|---|
| 4,437,511 A * | 3/1984 | Sheridan | F24D 11/0257 165/48.2 |
| 8,254,124 B2 * | 8/2012 | Keisling | F28D 15/00 361/699 |
| 9,366,448 B2 * | 6/2016 | Dean-Hendricks | F24F 3/1603 |
| 2010/0154448 A1 * | 6/2010 | Hay | G06F 1/20 62/175 |
| 2011/0256822 A1 * | 10/2011 | Carlson | H05K 7/20345 454/184 |
| 2013/0105107 A1 | 5/2013 | Chen et al. | |
| 2016/0242323 A1 | 8/2016 | Chen et al. | |
| 2017/0002471 A1 * | 1/2017 | Okamoto | C25B 9/04 |

FOREIGN PATENT DOCUMENTS

TW     I457522     10/2014
TW     I549600     9/2016

* cited by examiner

*Primary Examiner* — Jianying C Atkisson
*Assistant Examiner* — Meraj A Shaikh
(74) *Attorney, Agent, or Firm* — ScienBiziP, P.C.

(57) ABSTRACT

A cooling device for data center includes: a housing chamber configured for housing the data center; an air inlet plenum positioned at one side of the housing chamber and configured for inflowing of external natural wind; an air outlet plenum positioned at another side of the housing chamber; an air return plenum defining two opposite ends communicated with the air inlet plenum and the air outlet plenum, and comprising a return air damper; a controller connected to the return air damper and adapted for controlling the opening and closing of the return air damper; and a refrigeration module located in the air inlet plenum and connected to the controller. A cooling system for data center is also provided.

20 Claims, 5 Drawing Sheets

COOLING DEVICE FOR DATA CENTER AND COOLING SYSTEM FOR DATA CENTER

FIELD

The disclosure generally relates to cooling devices and cooling systems for data center.

BACKGROUNDING

A data center contains thousands of electrical equipment such as computers, communication equipment, and storage equipment, so the data center generates a lot of heat during operation. Data centers generally rely on refrigeration equipment such as air conditioners for heat dissipation, which consumes a lot of energy and increases costs.

Therefore, there is room for improvement within the art.

BRIEF DESCRIPTION OF THE DRAWING

Many aspects of the present disclosure can be better understood with reference to the drawings. The components in the drawings are not necessarily drawn to scale, the emphasis instead being placed upon clearly illustrating the principles of the disclosure. Moreover, in the drawings, like reference numerals designate corresponding parts throughout the views.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts have been exaggerated to better illustrate details and features of the present disclosure. The description is not to be considered as limiting the scope of the embodiments described herein.

Several definitions that apply throughout this disclosure will now be presented. The term "comprising" means "including, but not necessarily limited to"; it specifically indicates open-ended inclusion or membership in a so-described combination, group, series, and the like. The term "coupled" is defined as connected, whether directly or indirectly through intervening components, and is not necessarily limited to direct physical connection. The connection can be such that the objects are permanently connected or releasably connected.

Figure 1:
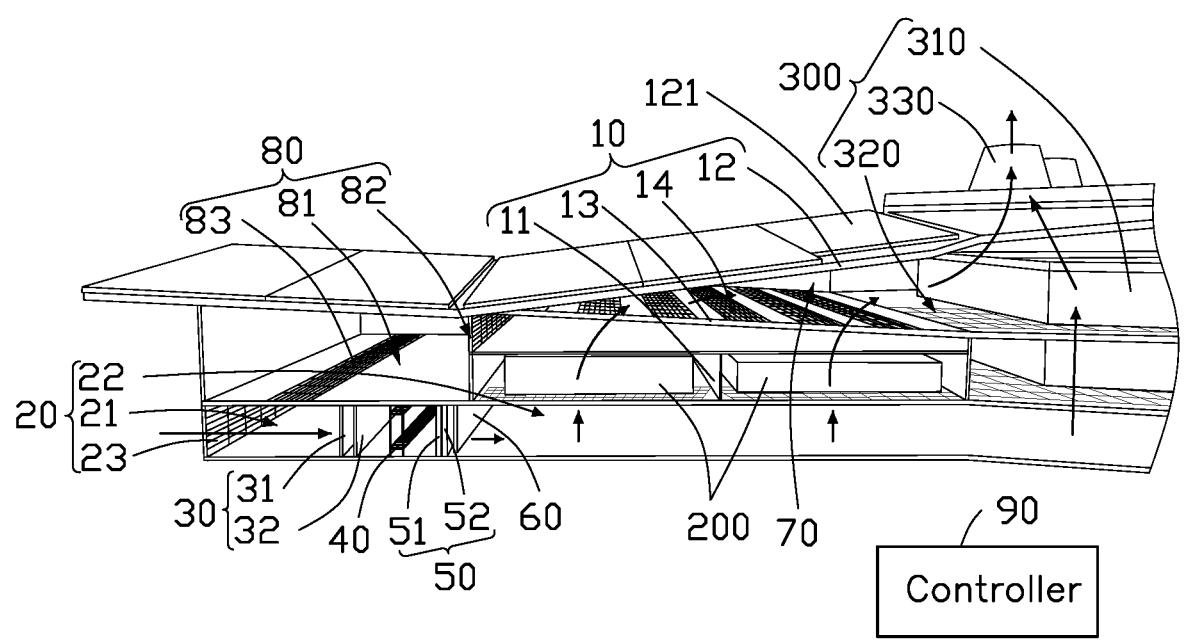
FIG. 1 is a schematic diagram of a cooling device with a flow direction of natural wind in accordance with an embodiment of the present disclosure.

FIG. 1 shows a cooling device 100 of an embodiment of the present disclosure. The cooling device 100 is configured for dissipating heat from a data center 200. The cooling device 100 includes a housing chamber 10, an air inlet plenum 20, a filter module 30, a humidification module 40, a refrigeration module 50, an air guiding module 60, an air outlet plenum 70, an air return plenum 80, and a controller 90.

Figure 2:
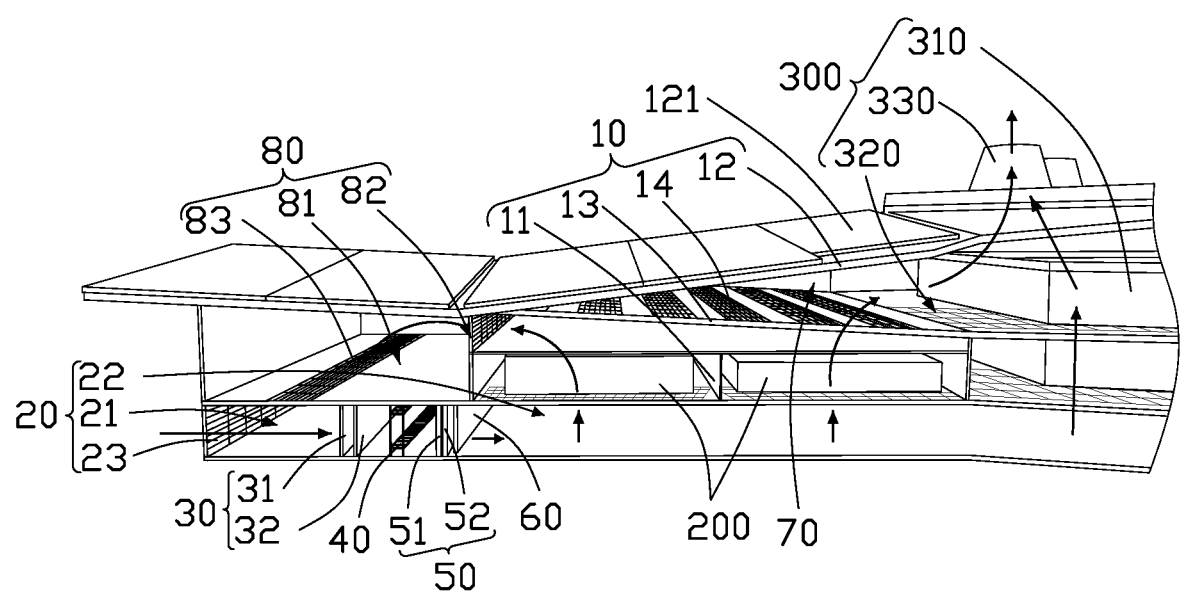
FIG. 2 is a schematic diagram of the cooling device shown in FIG. 1 with another flow direction of the natural wind.

The cooling device 100 is a building with a certain structure in which the data center 200 is housed in the housing chamber 10. The air inlet plenum 20 is located at a lower side of the housing chamber 10 and communicates with the housing chamber 10, so that natural wind can enter the housing chamber 10 along the air inlet plenum 20. The filter module 30, the humidification module 40, the refrigeration module 50, and the air guiding module 60 are sequentially positioned in the air inlet plenum 20 along a flow direction of the natural wind in the air inlet plenum 20. The natural wind is filtered, humidified, and cooled, and then introduced into the housing chamber 10. FIG. 1 and FIG. 2 show different flow paths of the natural wind.

The air outlet plenum 70 is located at an upper side of the housing chamber 10 and communicates with the housing chamber 10. The air return plenum 80 is positioned adjacent to the air inlet plenum 20 on a same side of the housing chamber 10. One end of the air return plenum 80 communicates with the housing chamber 10 and the other end of the air return plenum 80 communicates with the air inlet plenum 20. A return air damper 83 is provided in the air return plenum 80.

The controller 90 is electrically connected to the filter module 30, the humidification module 40, the refrigeration module 50, the air guiding module 60, and the return air damper 83. The controller 90 can control filtering, humidifying, cooling, and flow of the natural wind, and controls the opening and closing of the return air damper 83.

The housing chamber 10 includes a chamber body 11 and a roof 12. The chamber body 11 houses the data center 200. The roof 12 is sloped and includes solar panels 121, which can provide power for operating the cooling device 100.

The air inlet plenum 20 is substantially a layered structure. The air inlet plenum 20 includes a first air inlet 21 and a second air inlet 22. The natural wind enters the inlet plenum 20 from the first air inlet 21. The second air inlet 22 communicates with the housing chamber 10. Each of the first air inlet 21 and the second air inlet 22 is provided with an air inlet damper 23. The air inlet dampers 23 are substantially louvered. The controller 90 is electrically connected to the air inlet dampers 23. The controller 90 controls the natural wind entering the air inlet plenum 20 by controlling the opening and closing of the air inlet dampers 23.

The filter module 30 includes a first filter screen 31 and a second filter screen 32 positioned at intervals. The first filter screen 31 is located between the first air inlet 21 and the second filter screen 32. The second filter screen 32 is located between the first filter screen 31 and the second air inlet 22. The first filter screen 31 and the second filter screen 32 filter impurities and other undesirable elements from the natural wind. In at least one embodiment, the filter module 30 can be a filter assembly equipped with activated carbon, which is an effective filter for most purposes.

The humidification module 40 is located between the filter module 30 and the second air inlet 22. The humidification module 40 sprays water to form a water curtain, so that humidity of natural wind is increased when the natural wind passes through the water curtain. It should be noted that the humidification mode of the humidification module 40 is not limited to forming a water curtain. The humidification function of the humidification module 40 can also be realized by a hot water boiling method, a water flow method of other spraying methods. In addition, evaporation of water reduces the temperature of the natural wind.

When the natural wind having a certain humidity is introduced into the housing chamber 10, environment inside the housing chamber 10 can be maintained at a certain humidity. A certain level of humidity can prevent static electricity developing in the environment inside the housing chamber 10 when the climate is dry.

The refrigeration module 50 includes a first coil 51 and a second coil 52 spaced apart from each other in the air inlet plenum 20. The first coil 51 is located between the humidification module 40 and the second coil 52. The second coil 52 is located between the first coil 51 and the second air inlet 22.

A first cooling fluid flows in the first coil 51 and a second cooling fluid flows in the second coil 52. Temperature of the second cooling fluid is lower than that of the first cooling fluid. In at least one embodiment, the first cooling fluid is natural water from a natural water source such as river, lake, or the like. The second cooling fluid is chilled water from a chiller.

In different seasons, the temperature of the first cooling fluid may be higher than that of the second cooling fluid. For example, the temperature of the second cooling fluid can be generally 7° C., and the temperature of the first cooling fluid can be about 10~15° C. in summer and about 1~2° C. in winter. The first cooling fluid in the first coil 51 and the second cooling fluid in the second coil 52 can be used in combination to cool the natural wind.

In other embodiments, different number of coils, such as one or three, may be provided as needed.

The air guiding module 60 is located between the refrigeration module 50 and the second air inlet 22 and configured for introducing the natural wind into the housing chamber 10. In at least one embodiment, the air guiding module 60 is a fan wall composed of a plurality of fans. In other embodiments, the air guiding module 60 can be of fans with induced draft.

The roof 12 is obliquely positioned on the chamber body 11. A lower side of the roof 12 is fixedly connected to the chamber body 11. A gap is formed between an upper side of the roof 12 and the chamber body 11. A partition plate 13 is positioned between the roof 12 and the data center 200. The partition plate 13 is obliquely positioned on the chamber body 11. An inclined direction of the partition plate 13 is opposite to an inclined direction of the roof 12. An upper side of the partition plate 13 and the lower side of the roof 12 are connected to a same side of the chamber body 11. A lower side of the partition plate 13 leaves a gap to the upper side of the roof 12 to form the air outlet plenum 70.

The partition plate 13 includes a plurality of air outlet dampers 14 spaced apart from each other. The air outlet dampers 14 are substantially louvered. The air outlet dampers 14 are electrically connected to the controller 90. The controller 90 controls the opening and closing of the air outlet dampers 14.

The first air inlet 21 and the second air inlet 22 are provided with two air inlet dampers 23. The air inlet dampers 23 are substantially louvered. The controller 90 is electrically connected to the air inlet dampers 23. The controller 90 controls the natural wind entering the air inlet plenum 20 by controlling the opening and closing of the air inlet dampers 23.

In other embodiments, the partition plate 13 may be omitted, and the air outlet plenum 70 is directly connected to the housing chamber 10. The air outlet dampers 14 can be located between the air outlet plenum 70 and the housing chamber 10.

The air return plenum 80 is, but not limited to, a substantially rectangular parallelepiped structure. A solar panel may be laid on the air return plenum 80. The air return plenum 80 is located at the upper side of the chamber body 11 and includes a first return air outlet 81 and a second return air outlet 82. The first return air outlet 81 is located between the air return plenum 80 and the air inlet plenum 20. The second return air outlet 82 is located between the air return plenum 80 and the housing chamber 10. The first return air outlet 81 and the second return air outlet 82 are provided with two air return dampers 83. The air return dampers 83 are substantially louvered. The controller 90 is electrically connected to the air return dampers 83 and controls the opening and closing of the air return dampers 83.

In other embodiments, one end of the air return plenum 80 communicates with the air outlet plenum 70 and the other end of the air return plenum 80 communicates with the air inlet plenum 20. There may be a plurality of the air return dampers 83 positioned at intervals in the air return plenum 80.

Figure 3:
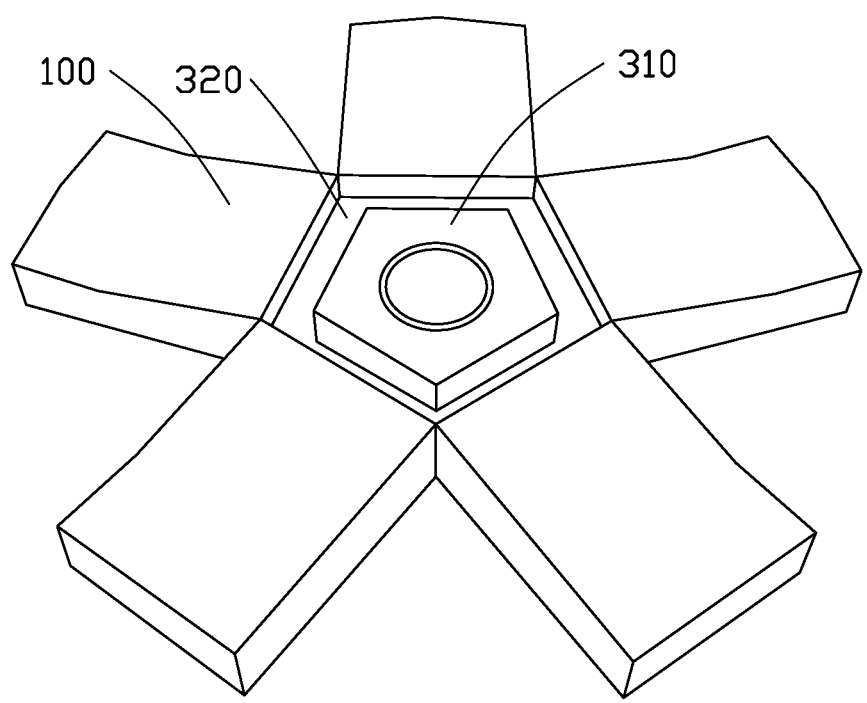
FIG. 3 is a schematic diagram of a cooling system in accordance with an embodiment of the present disclosure.

FIG. 3 shows a cooling system 1000 of an embodiment of the present disclosure. The cooling system 1000 can include a plurality of cooling devices 100 described above. A polygonal region 300 is surrounded by one side of each cooling device 100 adjacent to the housing chamber 10. In the present embodiment, there are five cooling devices 100, and the polygonal region 300 has a shape of pentagon. In other embodiments, a number of the cooling devices 100 can be 1, 2, 4, 6, or 8.

The polygonal region 300 includes a functional area 310. The functional region 300 is located above the air inlet plenum 20 and communicates with the air inlet plenum 20. A gap between the functional area 310 and the sides of the cooling devices 100 adjacent to the housing chambers 10 forms an annular plenum 320. The annular plenum 320 communicates with the air outlet plenum 70 of each cooling device 100, and top of the annular plenum 320 includes a plurality of chimneys 330. In at least one embodiment, the functional area 310 can be used as an office area.

Figure 4:
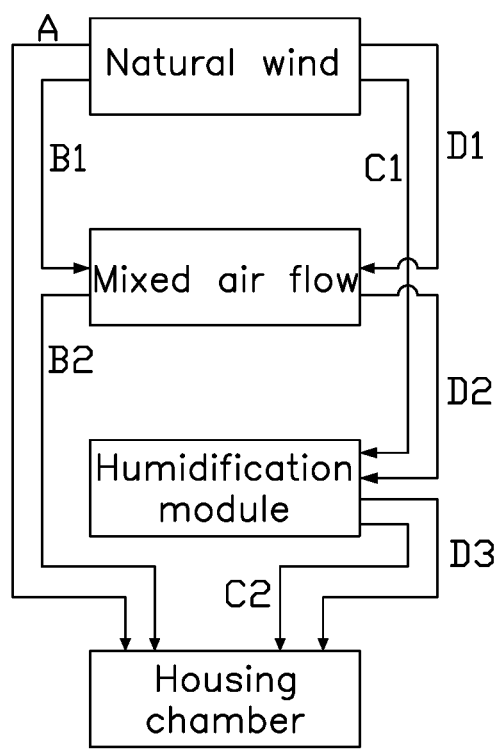
FIG. 4 is a schematic diagram of a flow pattern of the natural wind in the cooling device in accordance with an embodiment of the present disclosure.
Figure 5:
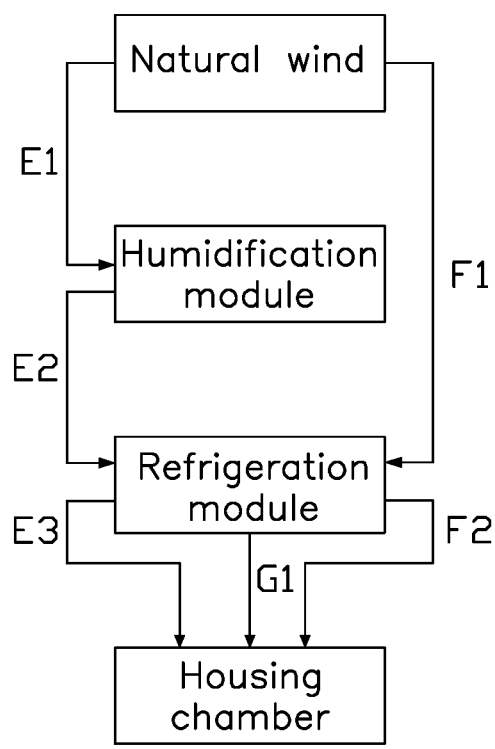
FIG. 5 is a schematic diagram of another flow pattern of the natural wind in the cooling device in accordance with an embodiment of the present disclosure.

Referring to FIG. 4 and FIG. 5, in practical applications, temperature and humidity inside the housing chamber 10 can be maintained at a preset temperature and a preset humidity. When the temperature of the natural wind is same as the preset temperature and the humidity of the natural wind is same as the preset humidity, the natural wind can directly enter the housing chamber 10 through plenum A and drive the heat generated by the data center 200 dissipating from the air outlet plenum 70.

When the temperature of the natural wind is lower than the preset temperature and the humidity of the natural wind is same as the preset humidity, the controller 90 controls the return air damper 83 to open. The natural wind in the air inlet plenum 20 is mixed with a heated flow of air entering the air inlet plenum 20 through the air return plenum 80 from the housing chamber 10, to form a mixed air flow having the preset temperature. The mixed air flow enters the housing chamber 10 through plenum B2 and drives the heat generated by the data center 200 dissipating from the air outlet plenum 70.

When the temperature of the natural wind is same as the preset temperature and the humidity of the natural wind is lower than the preset humidity, the natural wind passes through plenum C1 and is humidified to the preset humidity by the humidification module 40. The humidified air then passes through plenum C2 into the housing chamber 10 and drives the heat generated by the data center 200 dissipating from the air outlet plenum 70.

It can be understood that liquid water absorbs heat when it evaporates. In the present embodiment, the humidification module 40 humidifies the natural wind by using the water curtain. When the temperature of the natural wind is slightly higher than the preset temperature and the humidity of the natural wind is lower than the preset humidity, the natural wind can be cooled to the preset temperature and humidified to the preset humidity by passing through the plenum C1 and the plenum C2.

When the temperature of the natural wind is lower than the preset temperature and the humidity of the natural wind is lower than the preset humidity, the controller 90 controls the return air damper 83 to open. The natural wind passes through plenum D1 and is mixed with the heated flow of air entering the air inlet plenum 20 through the air return plenum 80 from the housing chamber 10, to form the mixed air flow having the preset temperature. The mixed air flow passes through plenum D2 and is humidified to the preset humidity by the humidification module 40, and then passes through plenum D3 into the housing chamber 10 and drives the heat generated by the data center 200 dissipating from the air outlet plenum 70.

When the temperature of the natural wind is higher than the preset temperature and the humidity of the natural wind is lower than the preset humidity, the natural wind passes through plenum E1 and is humidified by the humidification module 40 to a preset humidity. Such natural wind then passes through plenum E2 and is cooled by the refrigeration module 50 to a preset temperature, and then passes through plenum E3 into the housing chamber 10 and drives the heat generated by the data center 200 dissipating from the air outlet plenum 70.

When the temperature of the natural wind is higher than the preset temperature and the humidity of the natural wind is higher than or equal to the preset humidity, the refrigeration module 50 can condense moisture in the natural wind to reduce the humidity. The natural wind passes through plenum F1 and condensed by the refrigeration module 50 to the preset temperature and the preset humidity, and then passes through plenum F2 into the housing chamber 10 and drives the heat generated by the data center 200 dissipating from the air outlet plenum 70.

When the temperature of the natural wind is much higher than the preset temperature, or the humidity of the natural wind is much higher than the preset humidity, or the quality of the natural wind is too low to meet the standard, the controller 90 controls the return air damper 83 to open and controls the air outlet damper 14 and the air inlet damper 23 to close. The heated flow of air entering the air inlet plenum 20 is humidified by the humidification module 40 and cooled by the refrigeration module 50 to the preset temperature and the preset humidity, and then passes through plenum G1 into the housing chamber 10 and drives the heat generated by the data center 200 dissipating from the air outlet plenum 70.

The cooling device 100 and the cooling system 1000 provided by the present disclosure utilize natural wind to cool the data center 200, effectively saving costs. The cooling device 100 and the cooling system 1000 are not limited to being building structures, they may also be movable mechanisms.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being exemplary embodiments of the present disclosure.

What is claimed is:

1. A cooling device for data center, comprising:
    a housing chamber configured for housing the data center;
    an air inlet plenum positioned at one side of the housing chamber and configured for inflowing of external natural wind;
    an air outlet plenum positioned at another side of the housing chamber;
    an air return plenum defining two opposite ends communicated with the air inlet plenum and the air outlet plenum respectively, and comprising a return air damper;
    a controller connected to the return air damper and adapted for controlling the opening and closing of the return air damper; and
    a cooling coil located in the air inlet plenum and connected to the controller, wherein, when a temperature of the natural wind is higher than or equal to a preset temperature, the controller controls the return air damper to close, the natural wind is cooled by the cooling coil to the preset temperature, and then the natural wind enters the housing chamber and drives heat generated by the data center dissipating from the air outlet plenum;
    wherein, when the temperature of the natural wind is lower than the preset temperature, a mixed air flow having the preset temperature is obtained by mixing the natural wind with a heated flow of air entered the air inlet plenum through the air return plenum from the housing chamber, and then the mixed air flow enters the housing chamber and drives heat generated by the data center dissipating from the air outlet plenum; and
    wherein the housing chamber comprises a chamber body and a roof covering the chamber body, the roof is sloped, a partition plate is obliquely positioned between the air outlet plenum and the housing chamber, the partition plate comprises at least one air outlet damper connected to the controller and configured for allowing airflow from the housing chamber inflows to the air outlet plenum, an inclined direction of the partition plate is opposite to an inclined direction of the roof, and a lower side of the partition plate leaves a gap to a upper side of the roof to form the air outlet plenum.

2. The cooling device for data center as claimed in claim 1, wherein the air return plenum comprises a first return air outlet and a second return air outlet, the first return air outlet is located between the air return plenum and the air inlet plenum, the second return air outlet is located between the air return plenum and the housing chamber, and the cooling coil is located between the first return air outlet and the housing chamber.

3. The cooling device for data center as claimed in claim 2, wherein the cooling coil comprises a first coil and a second coil spaced apart from each other in the air inlet plenum, a first cooling fluid flowing in the first coil, and a second cooling fluid flowing in the second coil, the first cooling fluid and the second cooling fluid are configured for cooling the natural wind.

4. The cooling device for data center as claimed in claim 3, wherein the first cooling fluid is water from a natural water source, and the second cooling fluid is chilled water from a chiller.

5. The cooling device for data center as claimed in claim 3, wherein the cooling device further comprises an air guider connected to the controller, and located between the second coil and the housing chamber.

6. The cooling device for data center as claimed in claim 2, wherein the cooling device further comprises a filter connected to the controller and configured for filtering the natural wind, and the filter is located in the air inlet plenum and positioned between the cooling coil and the first return air outlet.

7. The cooling device for data center as claimed in claim 6, wherein the cooling device further comprises a humidifier connected to the controller and configured for humidifying the natural wind, and the humidifier is located in the air inlet plenum and positioned between the filter and the cooling coil.

8. The cooling device for data center as claimed in claim 1, wherein the air outlet plenum is located above the housing chamber.

9. The cooling device for data center as claimed in claim 1, wherein the roof comprises a plurality of solar panels.

10. A cooling system for data center, comprising a plurality of cooling devices, and each of the plurality of cooling devices comprising:
a housing chamber configured for housing the data center;
an air inlet plenum positioned at one side of the housing chamber and configured for inflowing of external natural wind;
an air outlet plenum positioned at another side of the housing chamber;
an air return plenum defining two opposite ends communicated with the air inlet plenum and the air outlet plenum respectively, and comprising a return air damper;
a controller connected to the return air damper and adapted for controlling the opening and closing of the return air damper; and
a cooling coil located in the air inlet plenum and connected to the controller, wherein, when a temperature of the natural wind is higher than or equal to a preset temperature, the controller controls the return air damper to close, the natural wind is cooled by the cooling coil to the preset temperature, and then the natural wind enters the housing chamber and drives heat generated by the data center dissipating from the air outlet plenum;
wherein, when the temperature of the natural wind is lower than the preset temperature, a mixed air flow having the preset temperature is obtained by mixing the natural wind with a heated flow of air entered the air inlet plenum through the air return plenum from the housing chamber, and then the mixed air flow enters the housing chamber and drives heat generated by the data center dissipating from the air outlet plenum; and
wherein the housing chamber comprises a chamber body and a roof covering the chamber body, the roof is sloped, a partition plate is obliquely positioned between the air outlet plenum and the housing chamber, the partition plate comprises at least one air outlet damper connected to the controller and configured for allowing airflow from the housing chamber inflows to the air outlet plenum, an inclined direction of the partition plate is opposite to an inclined direction of the roof, and a lower side of the partition plate leaves a gap to a upper side of the roof to form the air outlet plenum.

11. The cooling system for data center as claimed in claim 10, wherein a polygonal region is surround by one side of each of the cooling devices adjacent to the housing chamber, and the polygonal region comprises a functional area communicated with the air inlet plenum.

12. The cooling system for data center as claimed in claim 11, wherein a gap between the functional area and the cooling devices forms an annular plenum, and the annular plenum communicates with the air outlet plenum of each of the plurality of cooling devices.

13. The cooling system for data center as claimed in claim 12, wherein top of the annular plenum comprises a plurality of chimneys.

14. The cooling system for data center as claimed in claim 10, wherein the air return plenum comprises a first return air outlet and a second return air outlet, the first return air outlet is located between the air return plenum and the air inlet plenum, the second return air outlet is located between the air return plenum and the housing chamber, and the cooling coil is located between the first return air outlet and the housing chamber.

15. The cooling system for data center as claimed in claim 14, wherein the cooling coil comprises a first coil and a second coil spaced apart from each other in the air inlet plenum, a first cooling fluid flowing in the first coil, and a second cooling fluid flowing in the second coil, the first cooling fluid and the second cooling fluid are configured for cooling the natural wind.

16. The cooling system for data center as claimed in claim 15, wherein the first cooling fluid is water from a natural water source, and the second cooling fluid is chilled water from a chiller.

17. The cooling system for data center as claimed in claim 15, wherein the cooling device further comprises an air guider connected to the controller, and located between the second coil and the housing chamber.

18. The cooling system for data center as claimed in claim 14, wherein the cooling device further comprises a filter connected to the controller and configured for filtering the natural wind, and the filter is located in the air inlet plenum and positioned between the cooling coil and the first return air outlet.

19. The cooling system for data center as claimed in claim 18, wherein the cooling device further comprises a humidifier connected to the controller and configured for humidifying the natural wind, and the humidifier is located in the air inlet plenum and positioned between the filter and the cooling coil.

20. The cooling system for data center as claimed in claim 10, wherein the air outlet plenum is located above the housing chamber.

* * * * *